(12) United States Patent
Kanno et al.

(10) Patent No.: US 8,552,284 B2
(45) Date of Patent: Oct. 8, 2013

(54) PIPE-SHAPED THERMOELECTRIC POWER GENERATING DEVICE

(71) Applicant: Panasonic Corporation, Kadoma (JP)

(72) Inventors: Tsutomu Kanno, Kyoto (JP); Akihiro Sakai, Nara (JP); Kohei Takahashi, Osaka (JP); Yuka Yamada, Nara (JP); Atsushi Omote, Osaka (JP); Daisuke Ueda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/675,900

(22) Filed: Nov. 13, 2012

(65) Prior Publication Data

US 2013/0068273 A1 Mar. 21, 2013

Related U.S. Application Data

(63) Continuation of application No. PCT/JP2011/003310, filed on Jun. 10, 2011.

(30) Foreign Application Priority Data

Jul. 30, 2010 (JP) ................................ 2010-171629
Jul. 30, 2010 (JP) ................................ 2010-171631
Jul. 30, 2010 (JP) ................................ 2010-171634
May 11, 2011 (JP) ................................ 2011-105964

(51) Int. Cl.
*H01L 35/28* (2006.01)

(52) U.S. Cl.
USPC .......................................... 136/224; 136/208

(58) Field of Classification Search
USPC ......... 136/201, 205, 211, 221, 224, 226, 227, 136/228, 208

See application file for complete search history.

(56) References Cited

U.S. PATENT DOCUMENTS

| | | | |
|---|---|---|---|
| 3,054,840 A * | 9/1962 | Alsing | 136/204 |
| 5,793,092 A | 8/1998 | Habermeier et al. | |
| 6,096,966 A * | 8/2000 | Nishimoto et al. | 136/205 |
| 7,560,639 B2 | 7/2009 | Kanno et al. | |
| 7,601,909 B2 | 10/2009 | Kanno et al. | |
| 2008/0303375 A1 | 12/2008 | Carver | |
| 2009/0133734 A1* | 5/2009 | Takahashi | 136/230 |
| 2010/0170551 A1 | 7/2010 | Hiroyama et al. | |

FOREIGN PATENT DOCUMENTS

| | | |
|---|---|---|
| JP | 02-151087 A | 6/1990 |
| JP | 06-177437 A | 6/1994 |

(Continued)

OTHER PUBLICATIONS

International Search Report issued in International Patent Application No. PCT/JP2011/003310 dated Sep. 13, 2011.

*Primary Examiner* — Eli Mekhlin
(74) *Attorney, Agent, or Firm* — McDermott Will & Emery LLP

(57) ABSTRACT

A pipe-shaped thermoelectric power generating device includes an internal through-hole along the axis direction of the pipe-shaped thermoelectric power generation device; a plurality of first cup-shaped components each made of metal; a plurality of second cup-shaped components each made of thermoelectric material; a first electrode; a second electrode. The plurality of first cup-shaped components and the plurality of second cup-shaped components are arranged alternately and repeatedly along the axis direction. The first electrode and the second electrode are provided respectively at one end and at the other end of the pipe-shaped thermoelectric power generation device.

17 Claims, 22 Drawing Sheets

(56) References Cited

FOREIGN PATENT DOCUMENTS

| JP | 08-247851 A | 9/1996 |
| JP | 11-068176 A | 3/1999 |
| JP | 2006-086402 A | 3/2006 |
| JP | 4078392 | 2/2008 |
| JP | 4124807 | 5/2008 |
| JP | 2008-305991 A | 12/2008 |

* cited by examiner

PIPE-SHAPED THERMOELECTRIC POWER GENERATING DEVICE

This is a continuation of International Application No. PCT/JP2011/003310, with an international filing date of Jun. 10, 2011, which claims priority of Japanese Patent Application No. 2010-171629, filed on Jul. 30, 2010, Japanese Patent Application No. 2010-171631, filed on Jul. 30, 2010, Japanese Patent Application No. 2010-171634, filed on Jul. 30, 2010, and Japanese Patent Application No. 2011-105964, filed on May 11, 2011, the contents of each of which are hereby incorporated by reference.

TECHNICAL FIELD

The present disclosure relates to a pipe-shaped thermoelectric power generating device.

BACKGROUND

Patent Literature 1 discloses a pipe-shaped thermoelectric power generating device.

CITATION LIST

Patent Literature

[Patent Literature 1]
Japanese Laid-open patent application publication No. 2006-086402 (Family: None)

SUMMARY

Technical Problem

The purpose of the present disclosure is to provide a novel pipe-shaped thermoelectric power generating device.

Solution to Problem

The present subject matter relates to a pipe-shaped thermoelectric power generation device. The pipe-shaped thermoelectric power generation device includes an internal through-hole along the axis direction of the pipe-shaped thermoelectric power generation device, a plurality of first cup-shaped components each made of metal, a plurality of second cup-shaped components each made of thermoelectric material, a first electrode and a second electrode. The plurality of the first cup-shaped components and the plurality of the plurality of second cup-shaped components are arranged alternately and repeatedly along the axis direction. The first electrode and the second electrode are provided respectively at one end and at the other end of the pipe-shaped thermoelectric power generation device. Each of the first cup-shaped components has a shape of a circular truncated cone, a shape of an elliptical truncated cone, or a shape of a truncated pyramid, and has a first internal surface and a first external surface. The first internal surface has a shape of a periphery of a circular truncated cone, a shape of a periphery of an elliptical truncated cone, or a shape of a periphery of a truncated pyramid. The first external surface has a shape of a periphery of a circular truncated cone, a shape of a periphery of an elliptical truncated cone, or a shape of a periphery of a truncated pyramid. Each of the first cup-shaped components includes a first through-hole at a bottom end thereof. The cross-sectional area of each of the first cup-shaped components decreases in the direction of the bottom end thereof. Each of the second cup-shaped components has a shape of a circular truncated cone, a shape of an elliptical truncated cone, or a shape of a truncated pyramid, and has a second internal surface and a second external surface. The second internal surface has a shape of a periphery of a circular truncated cone, a shape of a periphery of an elliptical truncated cone, or a shape of a periphery of a truncated pyramid. The second external surface has a shape of a periphery of a circular truncated cone, a shape of a periphery of an elliptical truncated cone, or a shape of a periphery of a truncated pyramid. Each of the second cup-shaped components includes a second through-hole at a bottom end thereof. The cross-sectional area of each of the second cup-shaped components decreases in the direction of the bottom end thereof. The internal through-hole is composed of the plurality of the first through-holes and the plurality of the second through-holes. Each of the first cup-shaped components is inserted in one adjacent second cup-shaped component in such a manner that the first external surface of each of the first cup-shaped components is adhered to the second internal surface of the one adjacent second cup-shaped component. The other adjacent second cup-shaped component is inserted in each of the first cup-shaped components in such a manner that the first internal surface of each first-cup shaped component is adhered to the second external surface of the other adjacent second cup-shaped component. The metal is nickel, cobalt, copper, aluminum, silver, gold, or alloy thereof. The thermoelectric material is Bi, $Bi_2Te_3$, PbTe, or $Bi_2Te_3$ containing Sb or Se. Further, the following mathematical formulas are satisfied:

5 degrees≤theta1≤45 degrees 5 degrees≤theta2≤45 degrees, and theta1=theta2, where theta1 represents an angle formed by a part of the first cup-shaped component in which the cross-sectional area is decreased and the axis direction of the first cup-shaped component, and theta2 represents an angle formed by a part of the second cup-shaped component in which the cross-sectional area is decreased and the axis direction of the second cup-shaped component.

Advantageous Effects

The present disclosure provides a novel pipe-shaped thermoelectric power generating device.

DESCRIPTION OF EMBODIMENTS

The embodiment of the present disclosure is described below.

Figure 1:
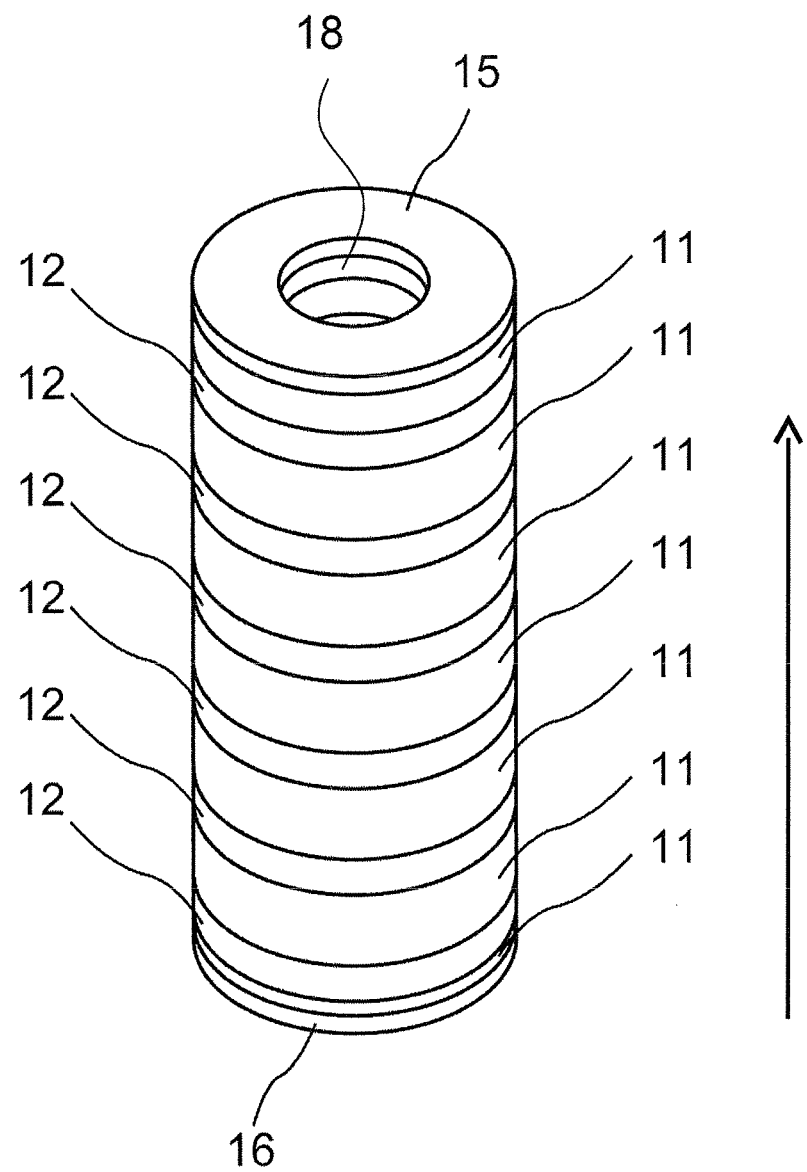
FIG. 1 shows an exemplary schematic view of a pipe-shaped thermoelectric power generating device according to the present embodiment.

FIG. 1 shows an exemplary schematic view of a pipe-shaped thermoelectric power generating device according to the present embodiment.

This pipe-shaped thermoelectric power generating device includes an internal through-hole 18, a plurality of first cup-shaped components 11, a plurality of second cup-shaped components 12, a first electrode 15, and a second electrode 16.

The internal through-hole 18 is provided along the axial direction of the pipe-shaped thermoelectric power generating device. The axial direction is the direction indicated by the arrow depicted in FIG. 1.

The first electrode 15 and the second electrode 16 are arranged at one end and at the other end of the pipe-shaped thermoelectric power generating device, respectively.

Each first cup-shaped component 11 is made of metal. An example of the metal is nickel, cobalt, copper, aluminum, silver, gold, or alloy thereof. Nickel, cobalt, copper, or aluminum is preferred.

Each second cup-shaped component 12 is made of thermoelectric conversion material. An example of the thermoelectric conversion material is Bi, $Bi_2Te_3$, or PbTe. $Bi_2Te_3$ may contain Sb or Se.

Figure 2:
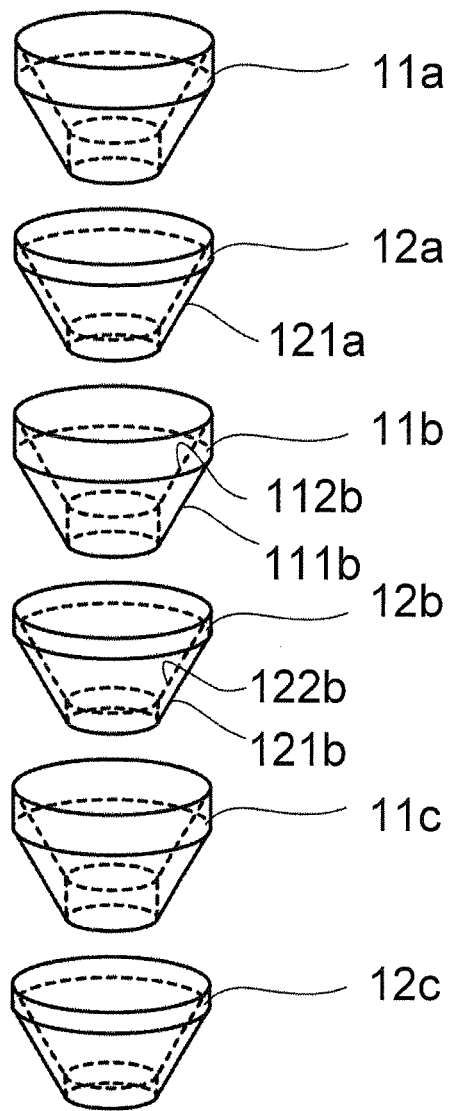
FIG. 2 shows a partial exploded view of the pipe-shaped thermoelectric power generating device.

FIG. 2 shows a partial exploded view of the pipe-shaped thermoelectric power generating device. As shown in FIG. 2, the three first cup-shaped components 11a-11c and the three second cup-shaped components 12a-12c are arranged alternately along the axial direction. Each first cup-shaped component 11 has the same shape. Each second cup-shaped component 12 has the same shape, too.

Figure 3:
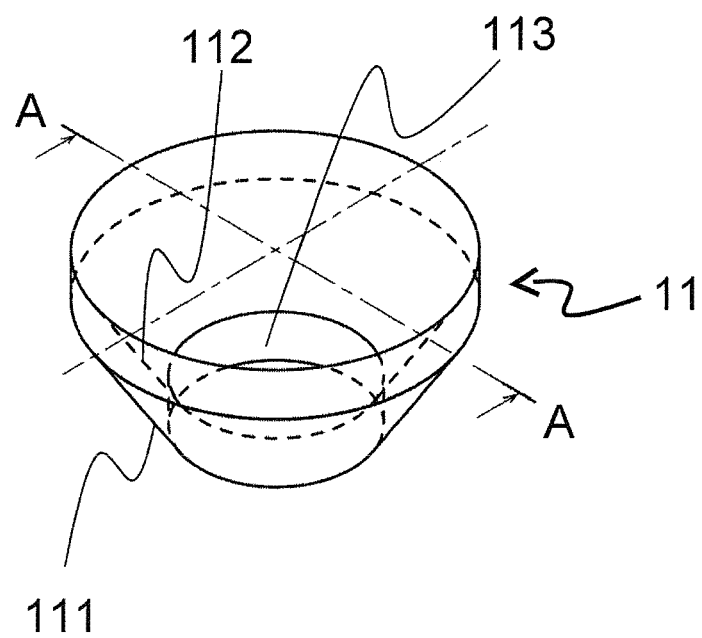
FIG. 3 shows an exemplary schematic view of one of the first cup-shaped components 11.
Figure 4:
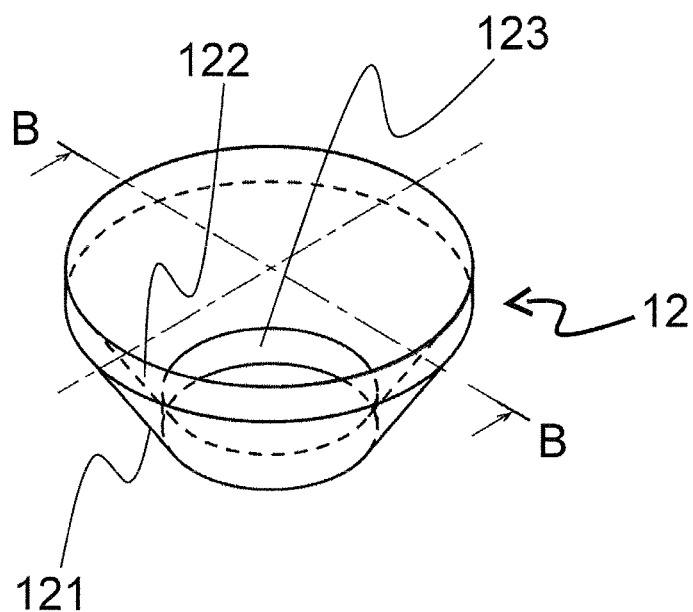
FIG. 4 shows an exemplary schematic view of one of the second cup-shaped components 12.

FIG. 3 shows one of the first cup-shaped components 11. As shown in FIG. 3, the first cup-shaped component 11 has a first inner surface 112 and a first external surface 111. The first cup-shaped component 11 has a first through-hole 113 at its bottom end. The first cup-shaped component 11 has an opening at its top end. The cross-sectional area of the first cup-shaped component 11 decreases in the direction toward its bottom end. As shown in FIG. 4, similarly to the shape of the first cup-shaped component 11, the second cup-shaped component 12 also has a second inner surface 122, a second external surface 121, and a second through-hole 123. The cross-sectional area of the second cup-shaped component 12 also decreases in the direction towards its bottom end.

As is clear from FIGS. 1-4, the internal through-hole 18 is composed of the plurality of the first through-holes 113 and the plurality of the second through-holes 123.

As shown in FIG. 2, the first cup-shaped component 11b is attached to one adjacent second cup-shaped component 12b in such a manner that the first external surface 111b of the first cup-shaped component 11b is adhered to the second internal surface 122b of the one adjacent second cup-shaped component 12b.

The other adjacent second cup-shaped component 12a is attached to the first cup-shaped component 11b in such a manner that the first internal surface 112b of the first cup-shaped component 11b is adhered to the second external surface 121a of the other adjacent second cup-shaped component 12a.

In this manner, one first cup-shaped component 11 is adhered to two adjacent second cup-shaped components 12. Similarly, one second cup-shaped component 12 is adhered to two adjacent first cup-shaped components 11.

It is preferable that the external surface 111b of the first cup-shaped component 11b is in contact with the second internal surface 122b of the one adjacent second cup-shaped component 12b. Instead of this, these surfaces may be adhered by a solder supplied between the external surface 111b of the first cup-shaped component 11b and the second internal surface 122b of the one adjacent second cup-shaped component 12b.

Similarly to the above, it is preferable that the internal surface 112b of the first cup-shaped component 11b is in contact with the second external surface 121a of the other adjacent second cup-shaped component 12a. Instead of this, these surfaces may be adhered by a solder supplied therebetween.

There should not be an interspace between the first cup-shaped component 11 and the second cup-shaped component 12, since the interspace prevents thermoelectric conversion when fluid is flowed through the internal through-hole 18, as described later. Furthermore, the fluid is leak out from the interspace. Solder may be filled into the interspace optionally, as described above.

An example of the numbers of the first cup-shaped component 11 and the second cup-shaped component 12 is not less than 100 and not more than 1000.

Figure 5:
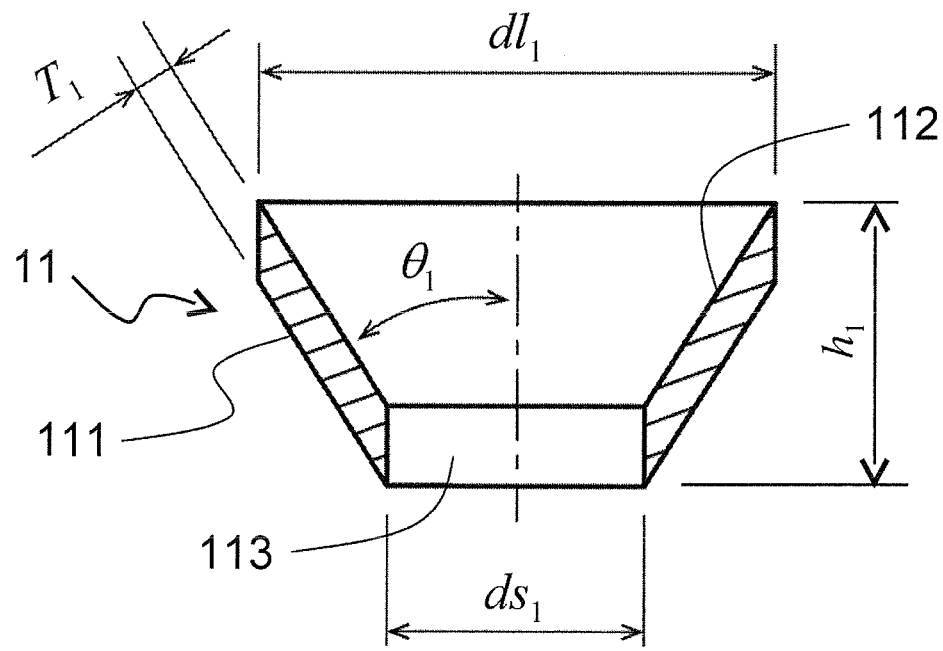
FIG. 5 shows a cross-sectional view of the A-A line depicted in FIG. 3.
Figure 6:
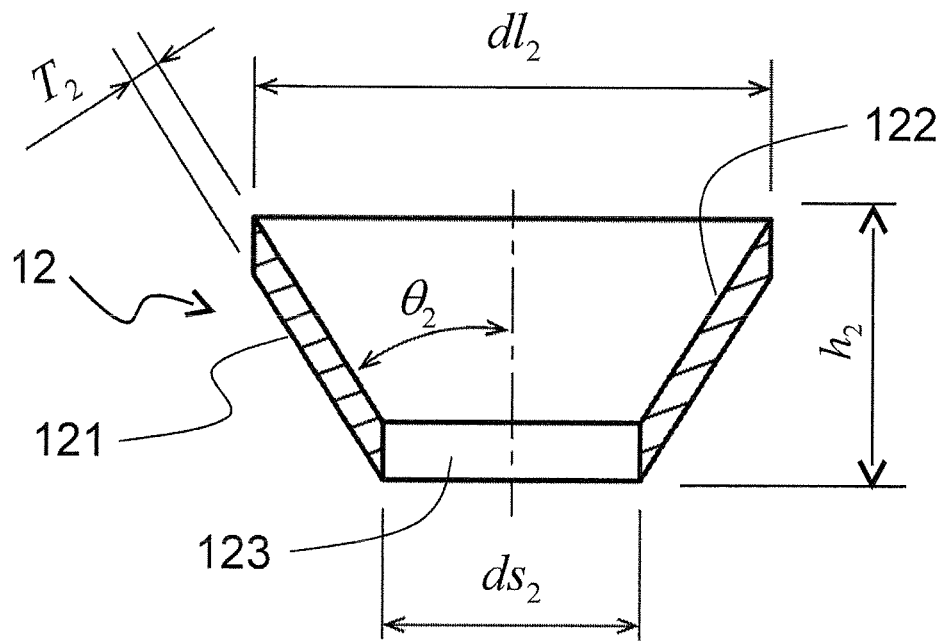
FIG. 6 shows a cross-sectional view of the B-B line depicted in FIG. 4.

FIG. 5 shows a cross-sectional view of the A-A line depicted in FIG. 3. FIG. 6 shows a cross-sectional view of the B-B line depicted in FIG. 4. Theta1 ($\theta_1$) and theta2 ($\theta_2$) represent gradient angles of the first cup-shaped component 11 and the second cup-shaped component 12, respectively. Namely, theta1 represents the angle formed by the portion where the cross-sectional area of the first cup-shaped component 11 is decreased in the direction toward its bottom end and the axial direction of the first cup-shaped component 11. Similarly, theta2 represents the angle formed by the portion where the cross-sectional area of the second cup-shaped component 12 is decreased in the direction toward its bottom end and the axial direction of the second cup-shaped component 12. The value of theta1 is equal to the value of theta2. The values of theta1 and theta2 are adjusted appropriately depending on the materials of the first cup-shaped component 11 and the second cup-component 12. The preferable values of theta1 and theta2 are not less than 5° and not more than 45°.

The cross-sectional shape of the internal through-hole 18 is not limited. The cross-sectional shape of the pipe-shaped thermoelectric power generating device is not limited, either.

When the cross-sectional shape of the first cup-shaped component 11 is a circle, $dl_1$ and $ds_1$ shown in FIG. 5 represents the widths of the top and bottom ends of the first cup-shaped component 11, respectively. The first cup-shaped component 11 has a height $h_1$ and a thickness $T_1$. Similarly to the case of FIG. 5, $dl_2$, $ds_2$, $h_2$, and $T_2$ shown in FIG. 6 represent a top end width, a bottom end width, a height, and a thickness of the second cup-shaped component 12, respectively.

The cross-sectional shape of the pipe-shaped thermoelectric power generating device is not limited. An example of the cross-sectional shape of the pipe-shaped thermoelectric power generating device is a circle, an ellipse, or a polygon. A circle is preferred. Namely, it is preferable that the pipe-shaped thermoelectric power generating device is cylindrical.

Figure 7:
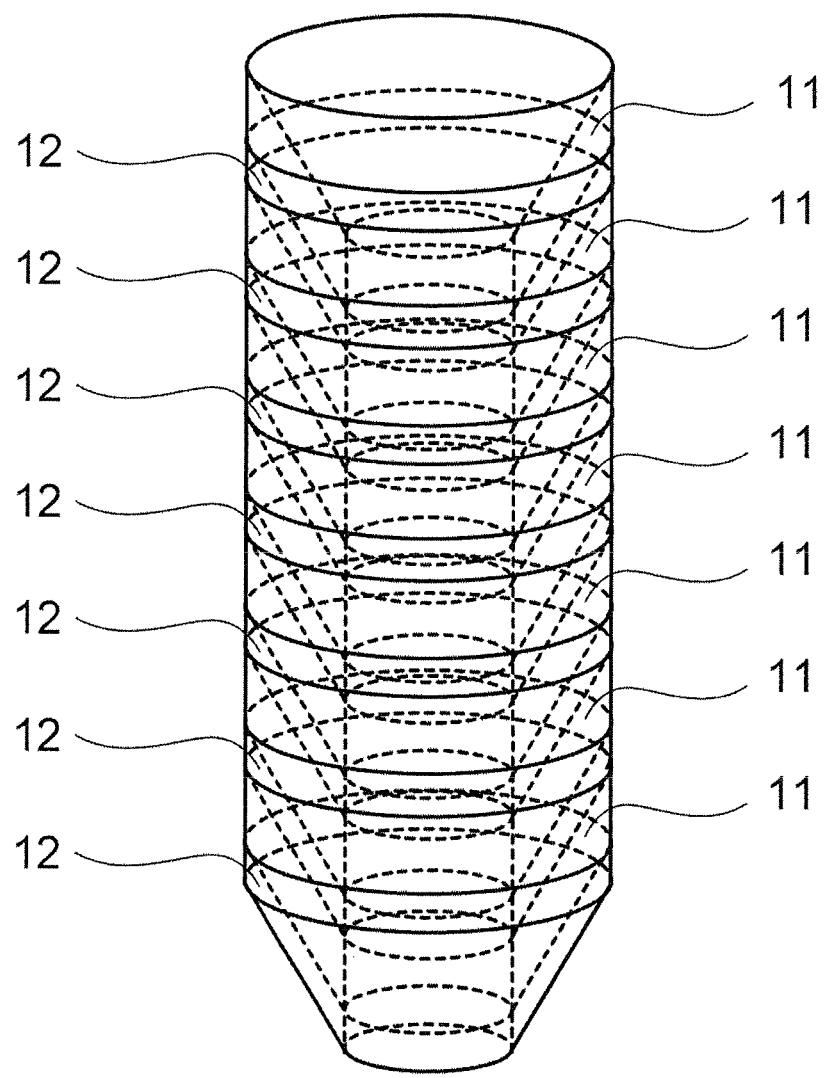
FIG. 7 shows one step in the method for fabricating the pipe-shaped thermoelectric power generating device.
Figure 8:
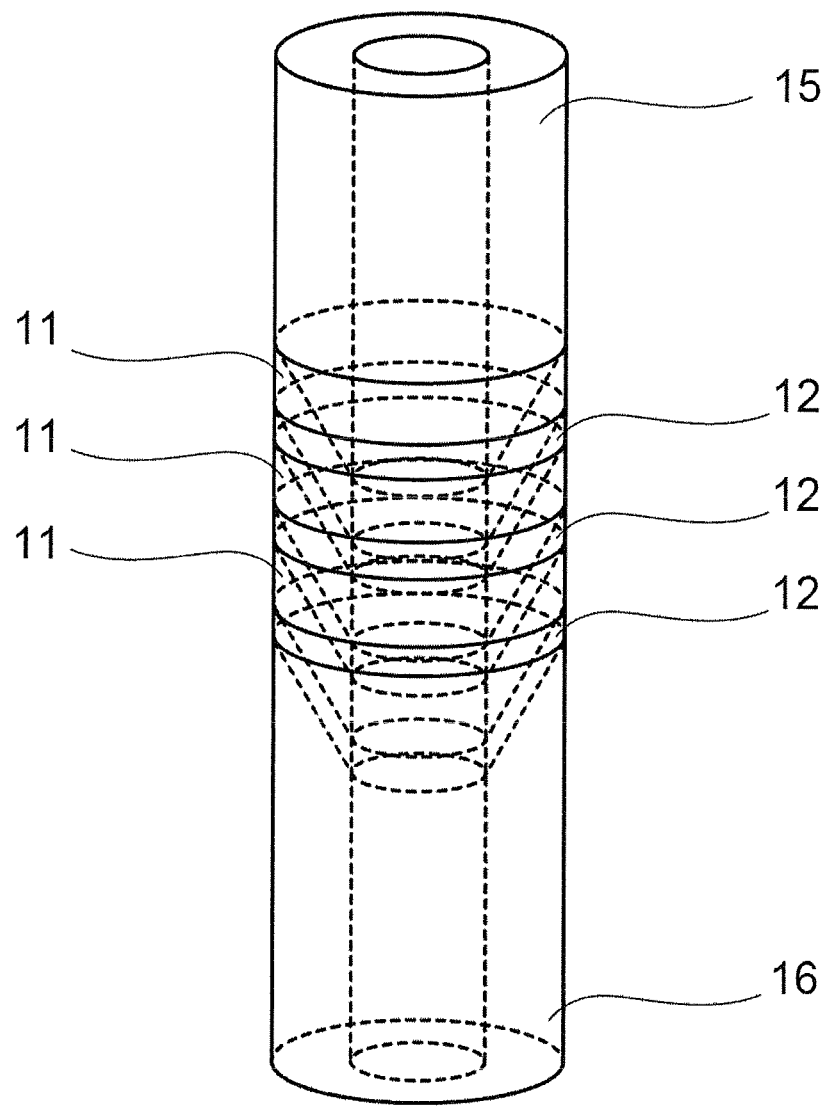
FIG. 8 shows one step in the method for fabricating the pipe-shaped thermoelectric power generating device.
Figure 9:
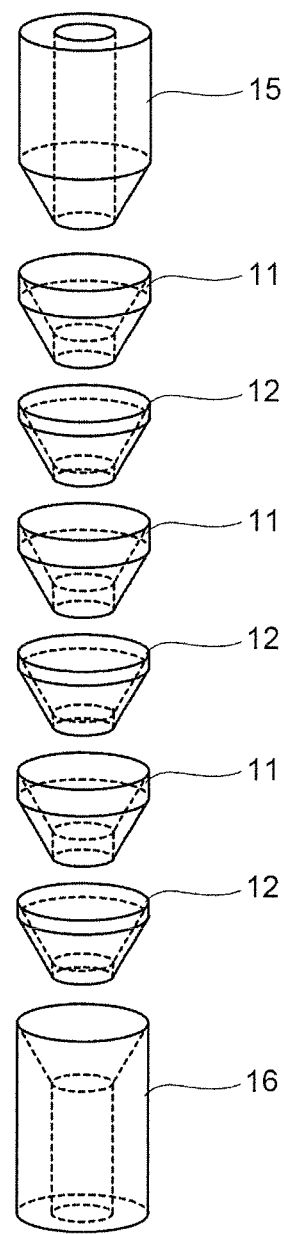
FIG. 9 shows an exploded view of the pipe-shaped thermoelectric power generating device shown in FIG. 8.

As shown in FIG. 7, the plurality of the first cup-shaped components 11 and the plurality of the second cup-shaped components 12 are arranged alternately and repeatedly. Subsequently, as shown in FIG. 8 and FIG. 9, the first electrode 15 and the second electrode 16 are joined at the end thereof and at the other end thereof, respectively, so as to fabricate the pipe-shaped thermoelectric power generation device. FIG. 9 is an exploded view of FIG. 8.

Figure 10:
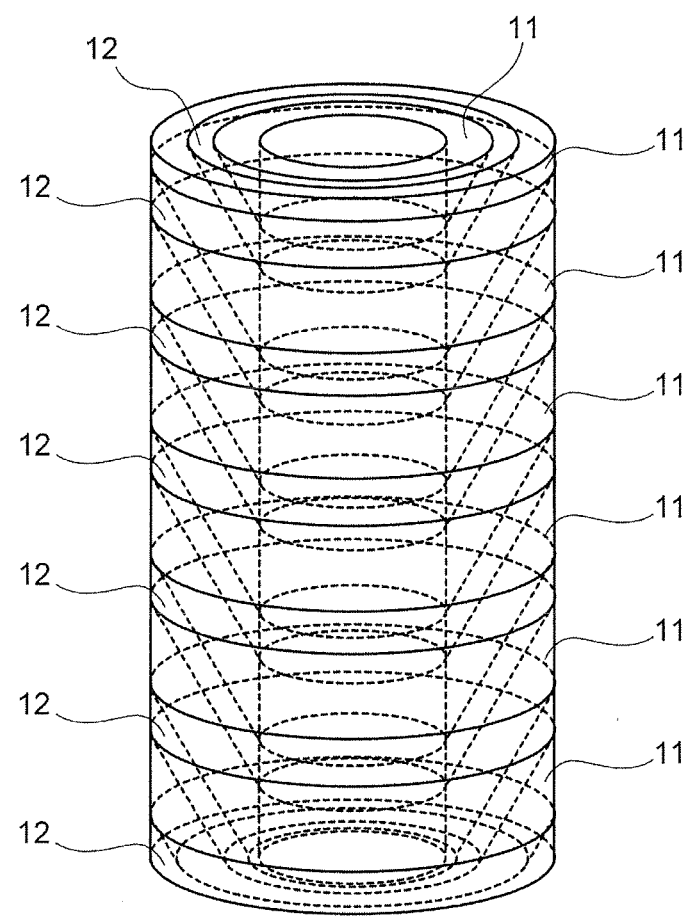
FIG. 10 shows one step in another method for fabricating the pipe-shaped thermoelectric power generating device.
Figure 11:
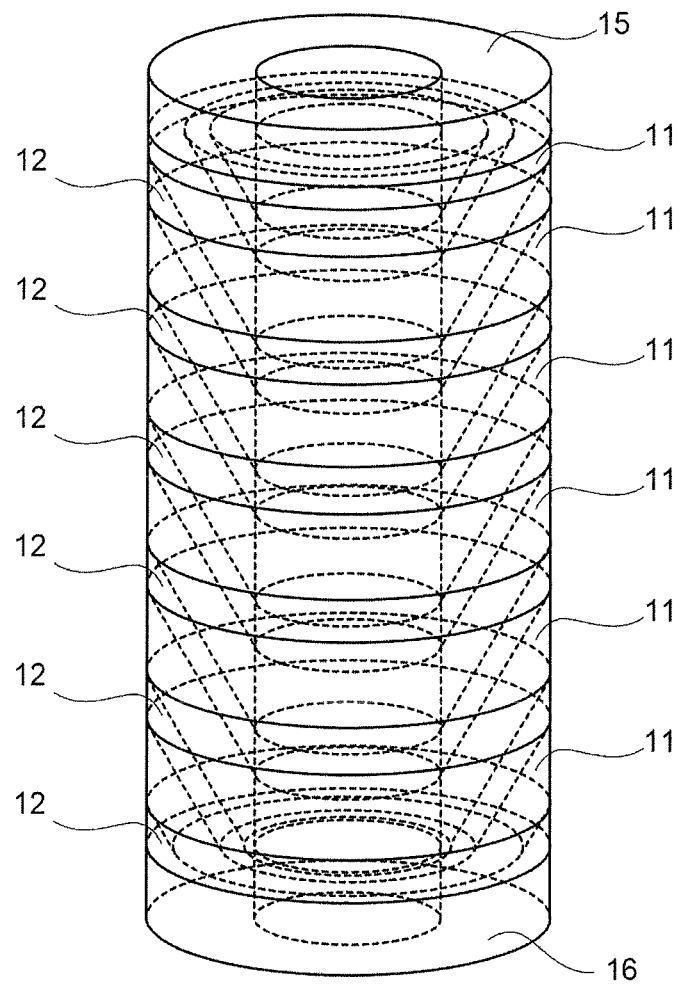
FIG. 11 shows one step in the another method for fabricating the pipe-shaped thermoelectric power generating device.

Instead of the procedure shown in FIG. 8 and FIG. 9, the first electrode 15 and the second electrode 16 may be joined as described below. After FIG. 7, a part of the one end and a part of the other end are cut to cause the one end and the other end to be flat, as shown in FIG. 10. Subsequently, the plate-like first electrode 15 and the plate-like second electrode 16 are joined to the one end and the other end, respectively, so as to fabricate the pipe-shaped thermoelectric power generation device.

Figure 12:
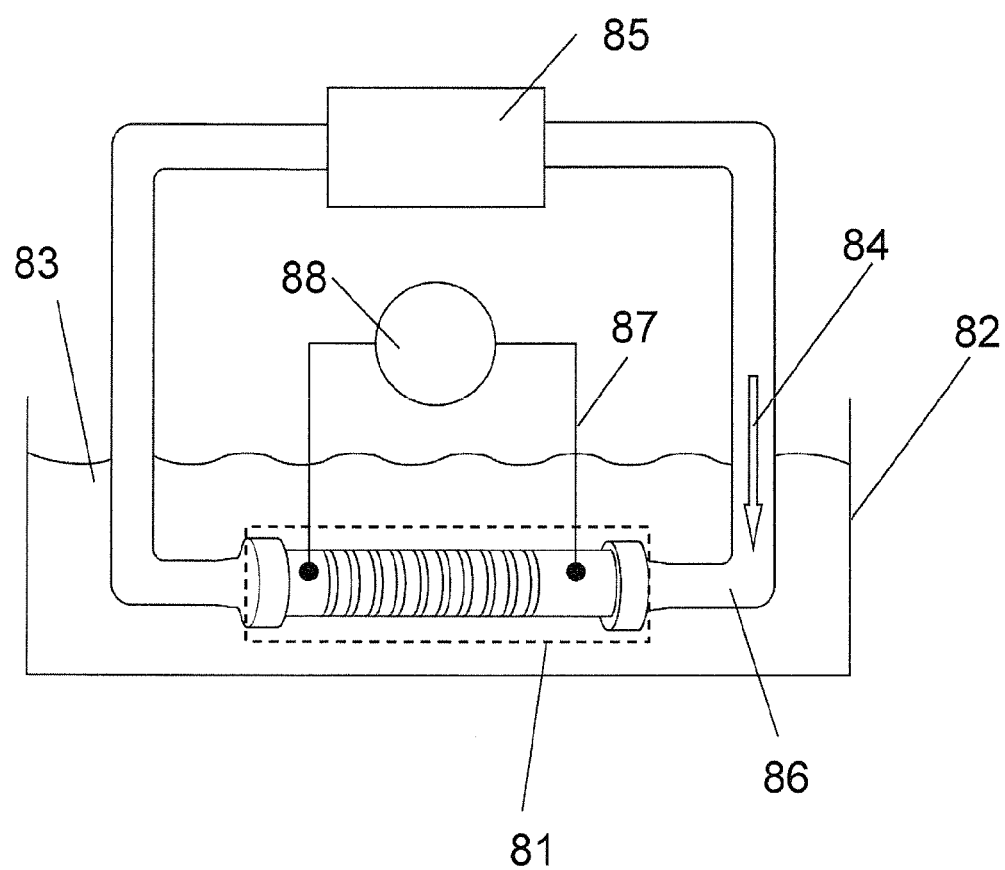
FIG. 12 shows an exemplary schematic view of a method for generating an electric power with use of the pipe-shaped thermoelectric power generation device.
Figure 13:
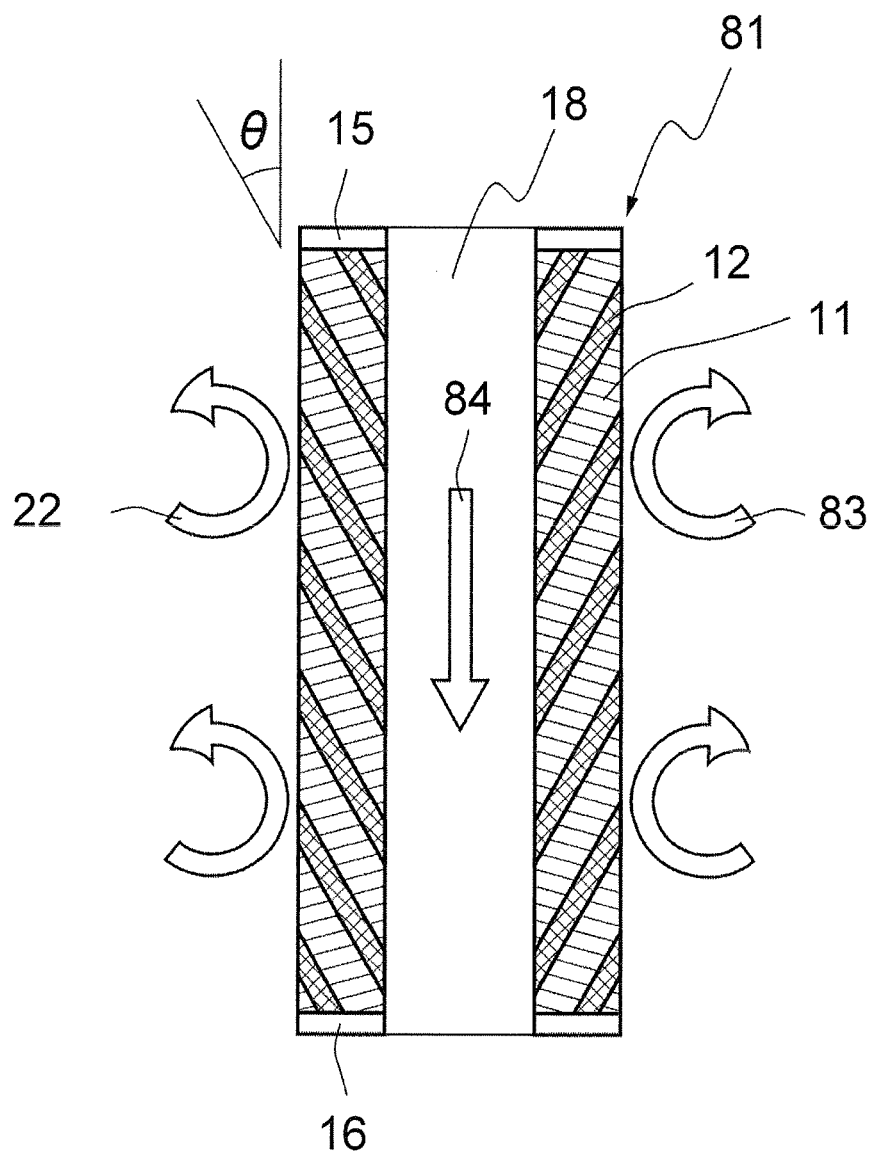
FIG. 13 shows a cross-sectional view of the pipe-shaped thermoelectric power generation device shown in FIG. 12.

A method for generating an electric power with the use of the pipe-shaped thermoelectric power generation device is described below with reference to FIGS. 12-13. FIG. 12 shows one example of the method for generating an electric power with the use of the pipe-shaped thermoelectric power generation device. FIG. 13 shows a cross-sectional view of the pipe-shaped thermoelectric power generation device shown in FIG. 12.

As shown in FIG. 12, the pipe-shaped thermoelectric power generation device 81 is immersed in cold fluid 83 stored in a vessel 82. It is preferable that the cold fluid is a liquid such as water. As shown in FIG. 13, warm fluid 84 is flowed through the internal through-hole 18. It is preferable that the warm fluid 84 is a liquid such as warm fluid. The warm fluid is circulated by a pump 85. The pump 85 and the pipe-shaped thermoelectric power generation device 81 are connected by two tubes made of silicone. Thus, electric voltage difference is generated between the first electrode 15 and the second electrode 16. In FIG. 12, a load 88 is electrically connected to the first electrode 15 and the second electrode 16 through two electric wires 87. The thermal difference between the cold fluid 83 and the warm fluid 84 is preferably not less than 20 degrees Celsius and not more than 80 degrees Celsius. The warm fluid may be stored in the vessel 82 whereas the cold fluid may be circulated through the internal through-hole 18 by the pump 85.

Figure 14:
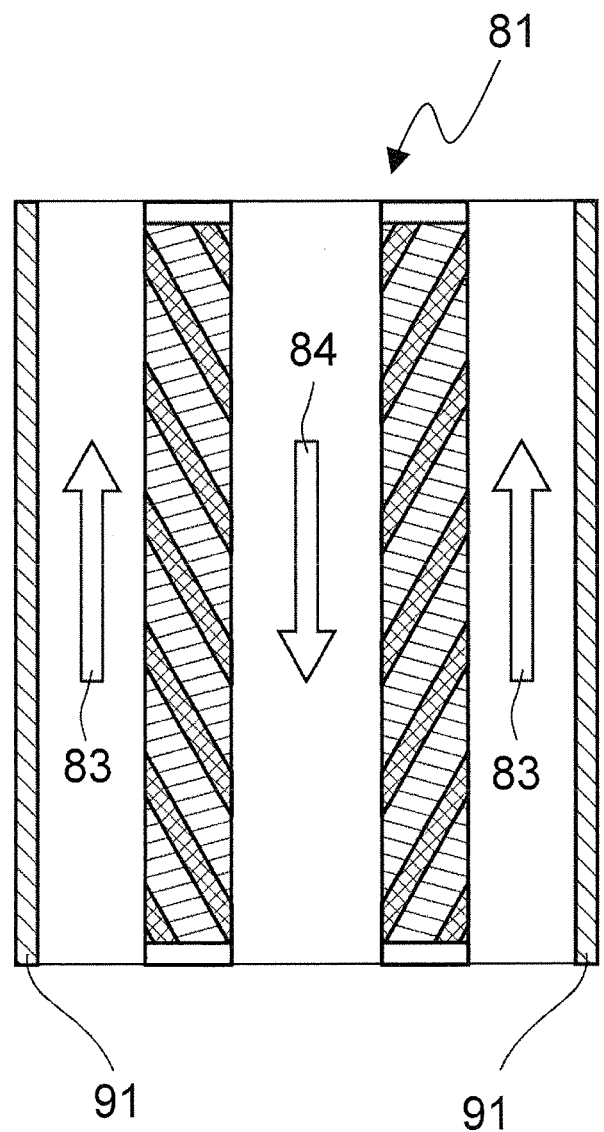
FIG. 14 shows a cross-sectional view of the pipe-shaped thermoelectric power generation device 81 along the axial direction.
Figure 15:
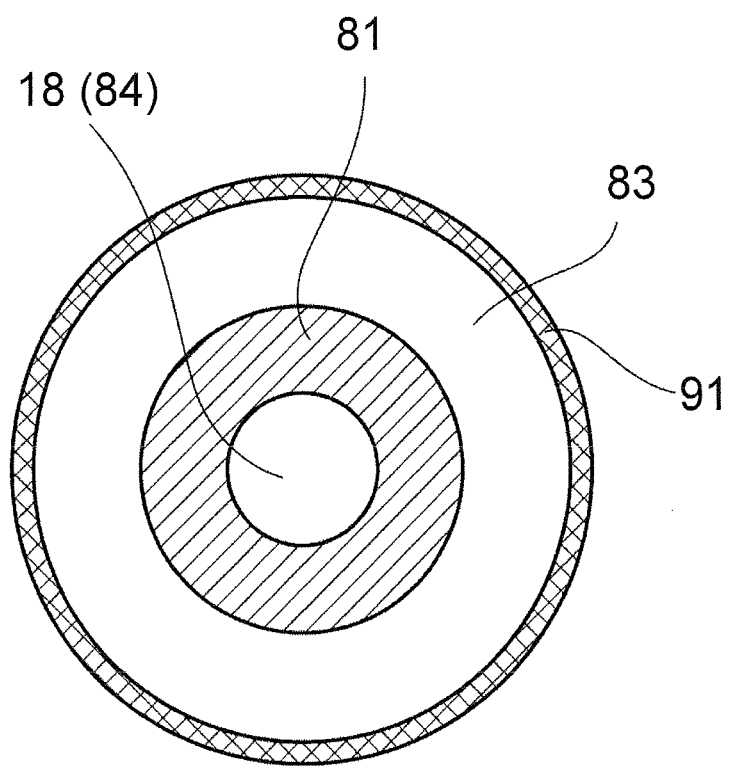
FIG. 15 shows a cross-sectional view of the pipe-shaped thermoelectric power generation device 81 perpendicular to the axial direction.

As shown in FIG. 14 and FIG. 15, the pipe-shaped thermoelectric power generation device 81 may be inserted into a tubular jacket 91. The cold fluid 83 is flowed between the tubular jacket 91 and the pipe-shaped thermoelectric power generation device 81, whereas the warm fluid 84 is flowed through the internal through-hole 18. Instead of the flows of these fluids, the warm fluid may be flowed between the tubular jacket 91 and the pipe-shaped thermoelectric power generation device 81, whereas the cold fluid may be circulated through the through-hole 18. An example of the material of the jacket 91 is stainless-steel, aluminum, titanium, hastelloy, or inconel alloy.

Figure 16:
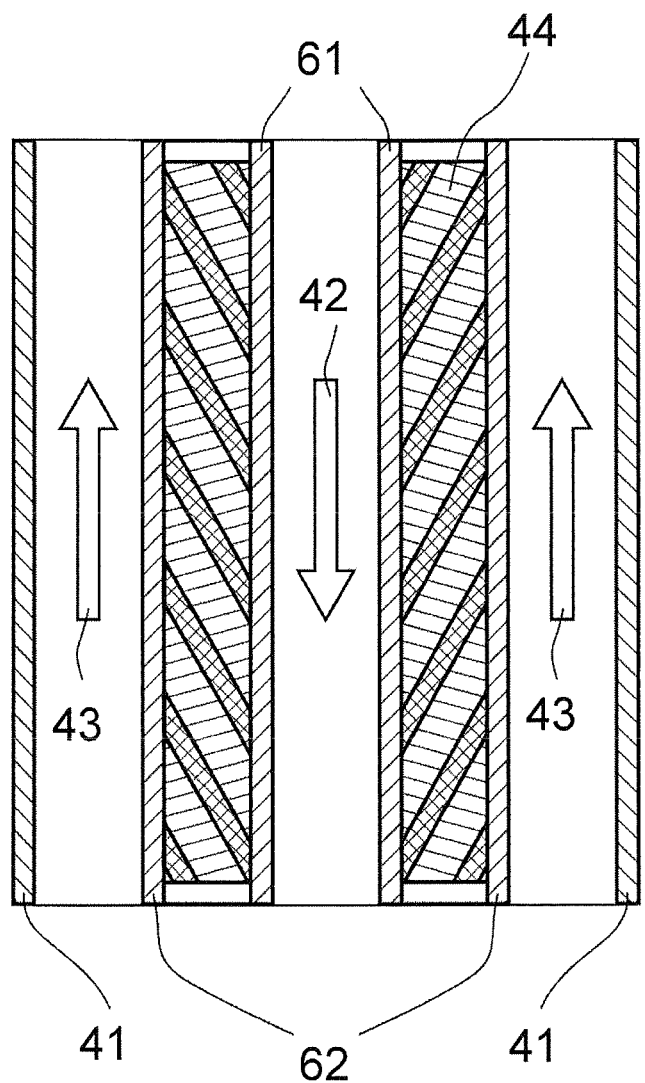
FIG. 16 shows a cross-sectional view of the pipe-shaped thermoelectric power generation device 81 along the axial direction.
Figure 17:
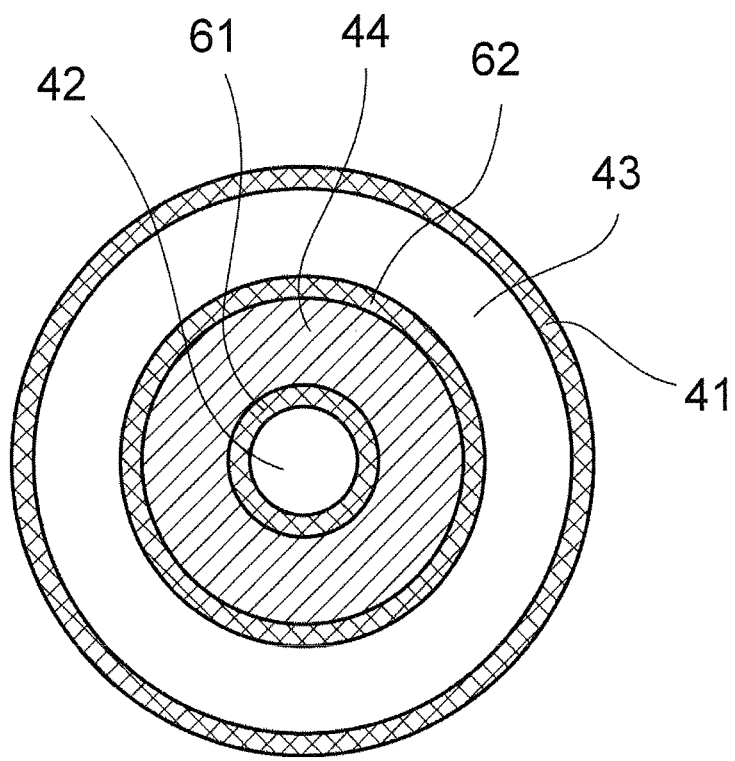
FIG. 17 shows a cross-sectional view of the pipe-shaped thermoelectric power generation device 81 perpendicular to the axial direction.

As shown in FIG. 16 and FIG. 17, an insulated internal wall 61 is preferably arranged around the internal through-hole 18 to protect the pipe-shaped thermoelectric power generation device 81 against corrosive material such as acid, alkaline, or salt, which may be contained in the fluid. An example of the material of the internal wall 61 is inorganic material such as aluminum oxide, aluminum nitride, silicon oxide, or silicon nitride; or organic material such as a polyimide resin or a fluorine resin. The metal coated by insulated material may be used.

Similarly to the above, an insulated external wall 62 is preferably arranged around the external surface of the pipe-shaped thermoelectric power generation device 81. An example of the material of the external wall 62 is same as that of the internal wall 61.

Figure 18:
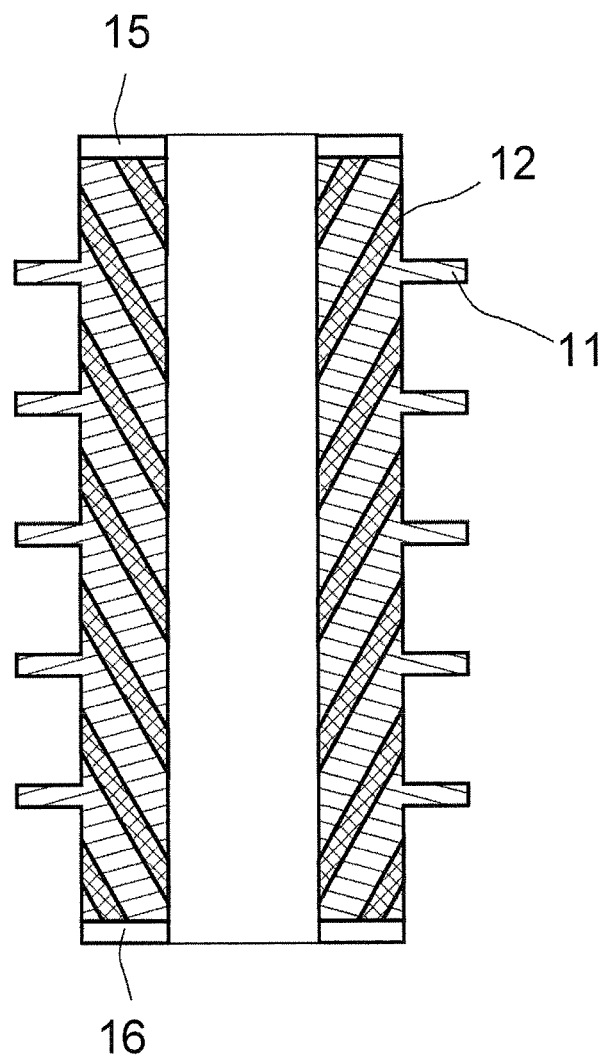
FIG. 18 shows a cross-sectional view of the pipe-shaped thermoelectric power generation device 81 along the axial direction.

As shown in FIG. 18, an external projection 71 may be provided around the external surface of the pipe-shaped thermoelectric power generation device 81 to increase thermoelectric power generation efficiency. The external projection 71 may be formed integrally on the external surface of the first cup-shaped component 11 or the second cup-shaped component 12.

Figure 19:
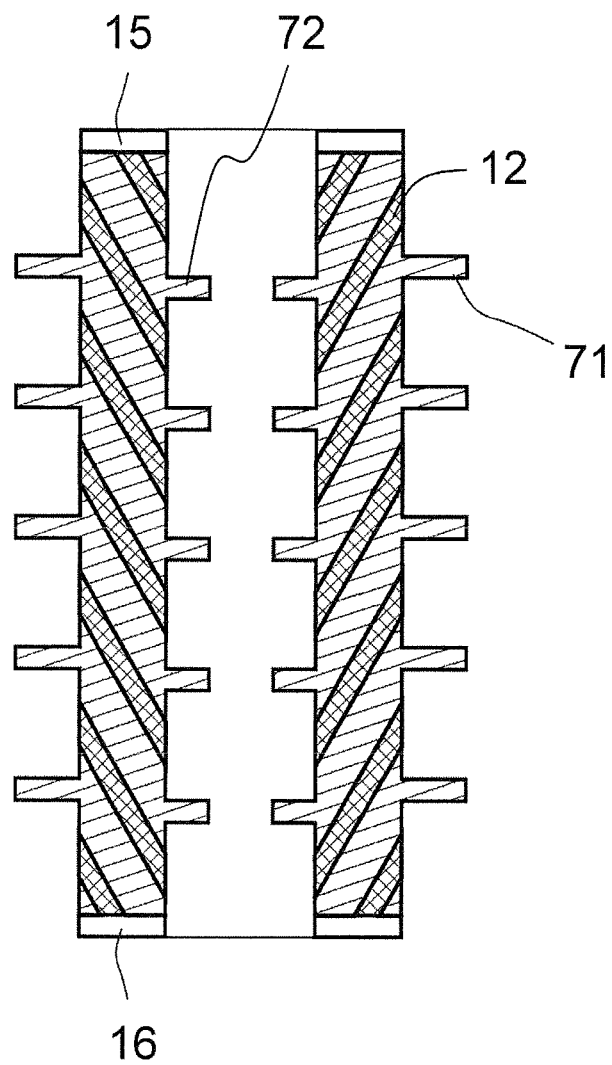
FIG. 19 shows a cross-sectional view of the pipe-shaped thermoelectric power generation device 81 along the axial direction.

As shown in FIG. 19, an external projection 72 may be provided around the internal through-hole 18 to increase thermoelectric power generation efficiency. The internal projection 72 may be formed integrally on the internal surface of the first cup-shaped component 11 or the second cup-shaped component 12.

Figure 20:
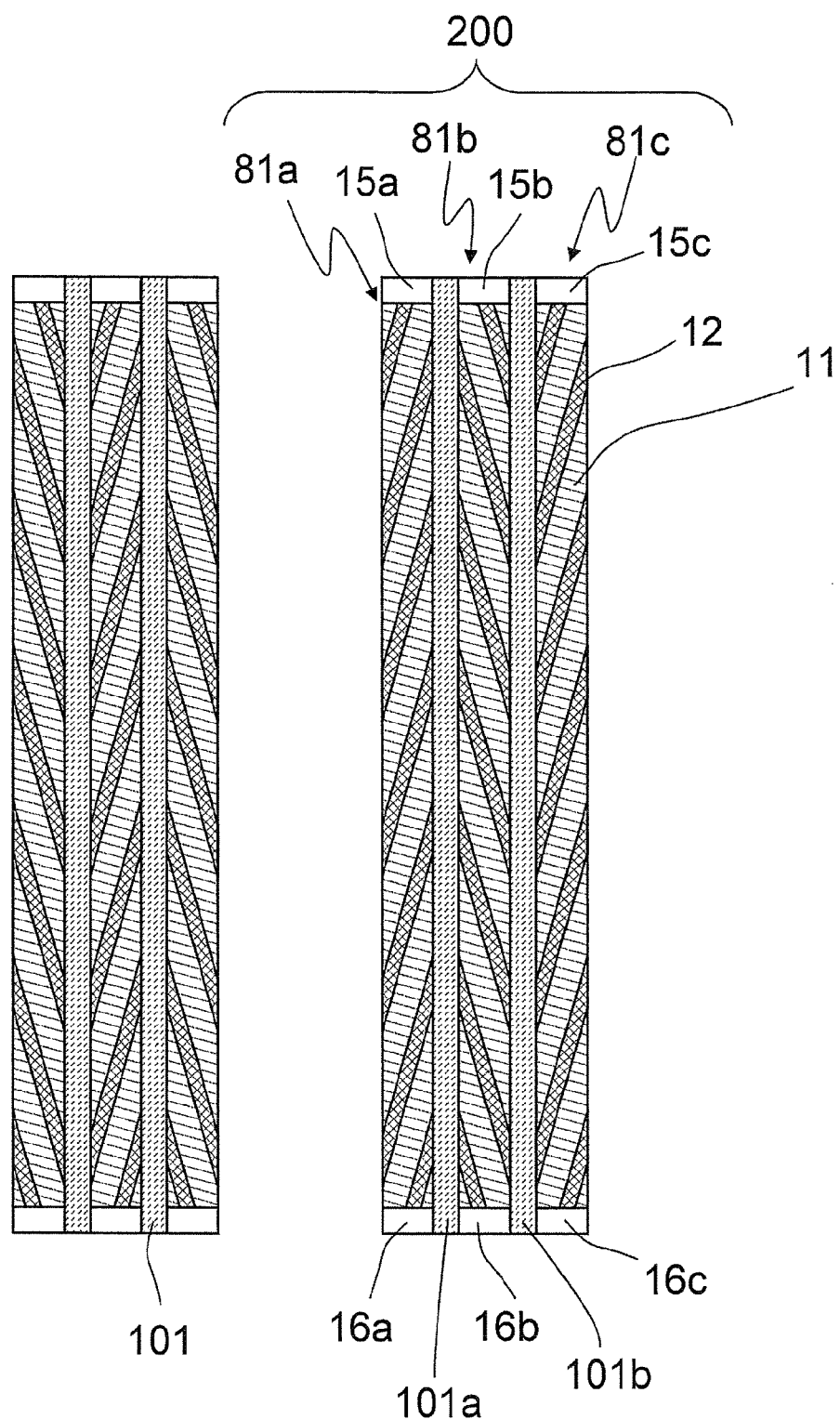
FIG. 20 shows a cross-sectional view of the pipe-shaped thermoelectric power generator 200 along the axial direction.
Figure 21:
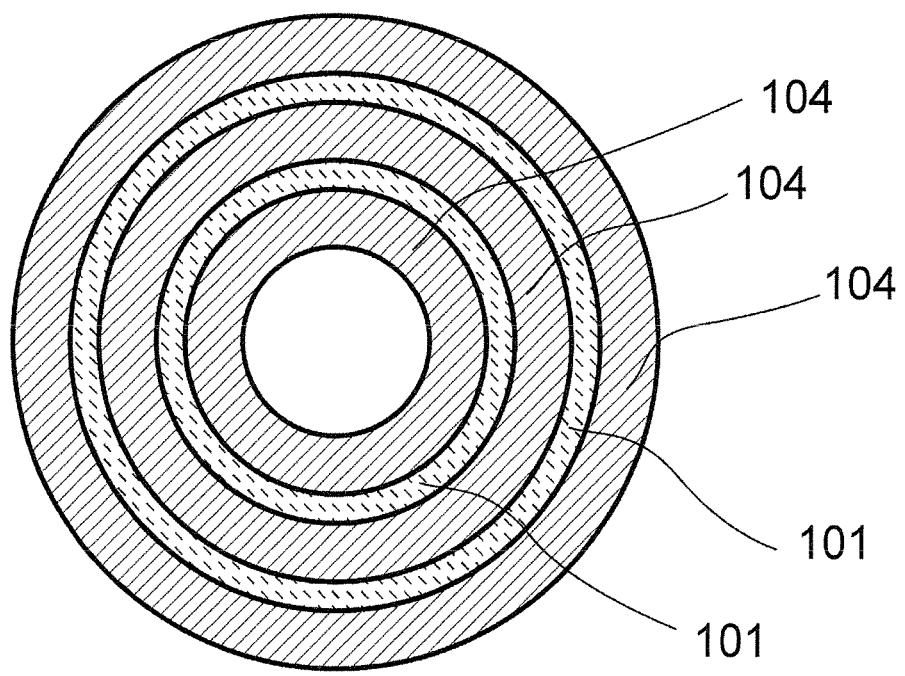
FIG. 21 shows a cross-sectional view of the pipe-shaped thermoelectric power generator 200 perpendicular to the axial direction.

In the present disclosure, as shown in FIG. 20 and FIG. 21, a plurality of the pipe-shaped thermoelectric power generation devices 81 may be used at the same time. In other words, a pipe-shaped thermoelectric power generator 200 includes a plurality of the pipe-shaped thermoelectric power generation devices 81. In FIG. 20 and FIG. 21, three pipe-shaped thermoelectric power generation devices 81a-81c are used. As shown in FIG. 21, the cross-sectional area of the first pipe-shaped thermoelectric power generation devices 81a is smallest, whereas the cross-sectional area of the third pipe-shaped thermoelectric power generation devices 81c is largest. Here, the term "cross-sectional area" means the cross-sectional area perpendicular to the axial direction of the pipe-shaped thermoelectric power generation device 81. The first pipe-shaped thermoelectric power generation device 81a is inserted into the internal through-hole 18 of the second pipe-shaped thermoelectric power generation device 81b. The external surface of the first pipe-shaped thermoelectric power generation device 81a is adhered to the internal surface of the second pipe-shaped thermoelectric power generation device 81b through a first insulation layer 101a. Similarly, the second pipe-shaped thermoelectric power generation device 81b is inserted into the internal through-hole 18 of the third pipe-shaped thermoelectric power generation device 81c. The external surface of the second pipe-shaped thermoelectric power generation device 81b is adhered to the internal surface of the third pipe-shaped thermoelectric power generation device 81c through a second insulation layer 101b.

As shown in FIG. 20, the second electrode 16a of the first pipe-shaped thermoelectric power generation device 81a is electrically connected to the second electrode 16b of the second pipe-shaped thermoelectric power generation device 81b. The first electrode 15b of the second pipe-shaped thermoelectric power generation device 81b is electrically to the first electrode 15c of the third pipe-shaped thermoelectric power generation device 81c. The two electric wires 87 (see FIG. 12) is electrically connected to the first electrode 15a of the first pipe-shaped thermoelectric power generation device 81a and the second electrode 16c of the third pipe-shaped thermoelectric power generation device 81c. Namely, these three pipe-shaped thermoelectric power generation devices 81a-81c are electrically connected in series.

Instead of this series connection, the plurality of the pipe-shaped thermoelectric power generation devices may be electrically connected in parallel.

The embodiment shown in FIG. 20 and FIG. 21 is generalized below. A number symbol of n represents a natural number of two or more. The cross-sectional area of the first pipe-shaped thermoelectric power generation device 81a is the smallest. The cross-sectional area of the $n^{th}$ pipe-shaped thermoelectric power generation device 81a is the largest. The external surface of the $(n-1)^{th}$ pipe-shaped thermoelectric power generation device 81 is adhered to the internal surface of the $n^{th}$ pipe-shaped thermoelectric power generation device 81 through the $(n-1)^{th}$ insulation layer 101.

When the n pipe-shaped thermoelectric power generation devices 81 are electrically connected in parallel, each of the first electrodes 15 is electrically connected to one another. Each of the second electrodes 16 is electrically connected to one another, too.

A case where the n pipe-shaped thermoelectric power generation devices 81 are connected in series is described below.

When n is an odd number of three or more, the second electrodes 16 of the $(2m-1)^{th}$, $(2m-3)^{th}$, $(2m-5)^{th}$, ..., and first pipe-shaped thermoelectric power generation devices 81 are electrically connected to the second electrodes 16 of the $(2m)^{th}$, $(2m-2)^{th}$, $(2m-4)^{th}$, ... and second pipe-shaped thermoelectric power generation devices 81, respectively. Here, the value of m is defined by the formula: $m=((n-1)/2)$. The first electrodes 15 of the $(2m)^{th}$, $(2m-2)^{th}$, $(2m-4)^{th}$, ... and second pipe-shaped thermoelectric power generation devices 81 are electrically connected to the first electrodes 15 of the $(2m+1)^{th}$, $(2m-1)^{th}$, $(2m-3)^{th}$, ... and third pipe-shaped thermoelectric power generation devices 81, respectively.

When n is even, the second electrodes 16 of the $(2m-1)^{th}$, $(2m-3)^{th}$, $(2m-5)^{th}$, ... and first pipe-shaped thermoelectric power generation devices 81 are electrically connected to the second electrodes 16 of the $(2m)^{th}$, $(2m-2)^{th}$, $(2m-4)^{th}$, ... and second pipe-shaped thermoelectric power generation devices 81, respectively. Here, the value of m is defined by the formula: $m=(n/2)$. When n is four or more, the first electrodes 15 of the $(2m-2)^{th}$, $(2m-4)^{th}$, ... and second pipe-shaped thermoelectric power generation devices 81 are electrically connected to the first electrodes 15 of the $(2m-1)^{th}$, $(2m-3)^{th}$, ... and third pipe-shaped thermoelectric power generation devices 81, respectively.

Figure 22:
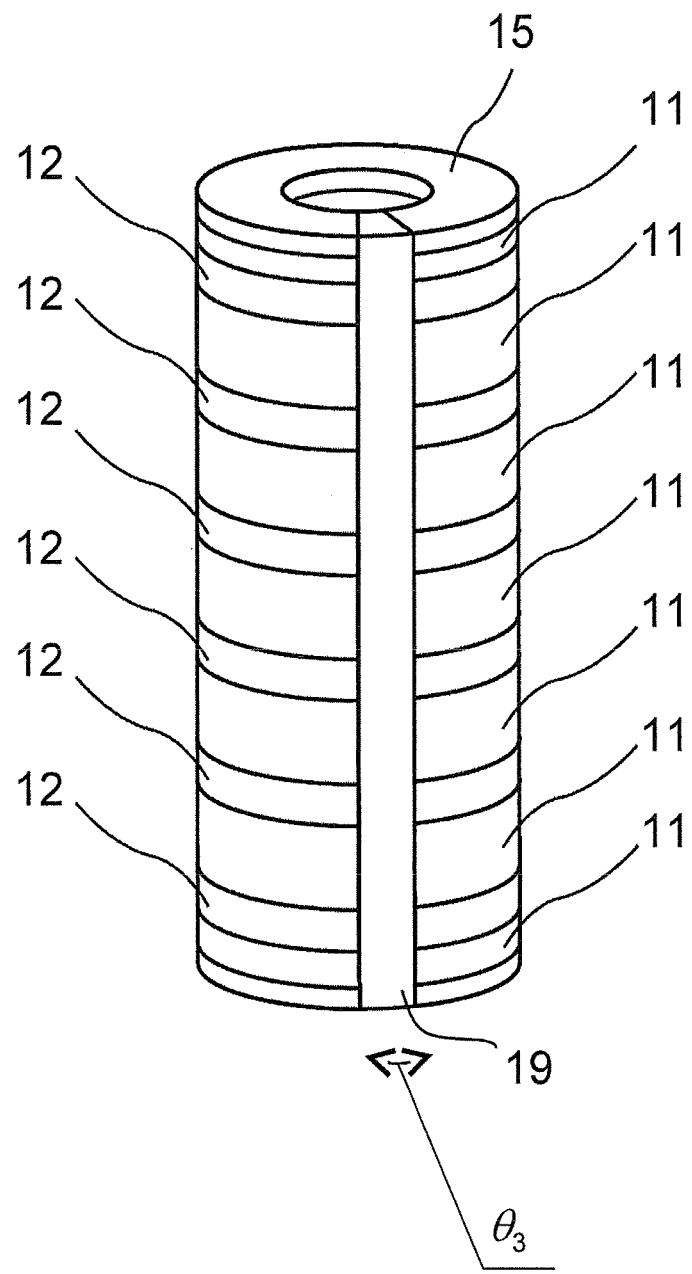
FIG. 22 shows a pipe-shaped thermoelectric power generating device according to the present embodiment.

As shown in FIG. 22, a groove 19 may be formed along the axial direction in the pipe-shaped thermoelectric power generation devices 81. The groove may be hollow; however, may be filled with insulator optionally. The angle of theta3 ($\theta_3$) is preferably not less than 1 degree and not more than 10 degrees.

EXAMPLES

The present subject matter is described in more detail with reference to the following examples.

Example 1A

In accordance with Table 1, the pipe-shaped thermoelectric power generation device 81 shown in FIG. 9 was obtained.

TABLE 1

| | |
|---|---|
| Material of the first cup-shaped component 11 | aluminum |
| The number of the first cup-shaped component 11 | 199 |
| $dl_1$ | 7 millimeters |
| $ds_1$ | 4 millimeters |
| $T_1$ | 0.7 millimeters |
| theta 1 ($\theta_1$) | 20 degrees |
| Material of the second cup-shaped component 12 | $Bi_{0.5}Sb_{1.5}Te_3$ |
| The number of the second cup-shaped component 12 | 200 |
| $dl_2$ | 7 millimeters |
| $ds_2$ | 4 millimeters |
| $T_2$ | 0.3 millimeters |
| theta 2 ($\theta_2$) | 20 degrees |
| $T_1:T_2$ | 7:3 |
| Material of the first electrode 15 and the second electrode 16 | copper |

Each end part of the pipe-shaped thermoelectric power generation device 81 was tightened up with a nut. A spring made of inconel alloy was inserted between the nut and the first electrode 15. While the pipe-shaped thermoelectric power generation device 81 was compressed by the spring along the axial direction, the pipe-shaped thermoelectric power generation device 81 was placed into a tubular oven. The pipe-shaped thermoelectric power generation device 81 was heated at 500 degrees Celsius for two hours.

After heated, the pipe-shaped thermoelectric power generation device 81 was cooled to room temperature. Thus, obtained was the pipe-shaped thermoelectric power generation device 81 having an external diameter of 7 millimeters, an internal diameter of 4 millimeters, and a length of 700 millimeters.

As shown in FIG. 12, the obtained pipe-shaped thermoelectric power generation device 81 was immersed in cold water 83 having a temperature of 20 degrees Celsius. Warm water 84 having a temperature of 80 degrees Celsius was circulated through the internal through-hole 18 at a flow rate of 10 liters/minute. Table 2 shows the result.

The maximum electric power energy was calculated by the following equation:

(the value of the maximum electric power energy)=
((open voltage between the electrodes)/2)$^2$/
(the value of the electric resistance between the electrodes).

Here, the open voltage is the voltage between the electrodes in a state where the temperature difference is applied and where no current is flowed.

The value of the electric resistance is obtained as below.

First, a constant current is flowed between the electrodes in a state where no temperature difference is applied so as to measure the voltage generated between the electrodes.

Then, the measured voltage was divided by the constant current so as to calculate the electric constant.

Examples 1B-1E

The experiments identical to example 1A were performed except for theta 1=theta 2=5, 10, 30 or 45 degrees.

TABLE 2

|  | theta 1 ($\theta_1$), theta 2 ($\theta_2$) | The value of the maximum electric power energy (mW) |
| --- | --- | --- |
| Example 1B | 5 | 2390 |
| Example 1C | 10 | 3480 |
| Example 1A | 20 | 1530 |
| Example 1D | 30 | 670 |
| Example 1E | 45 | 130 |

Examples 2A-2I

The experiments identical to example 1A were performed except that the ratio of $T_1:T_2$ was varied as shown in Table 3.

TABLE 3

|  | $T_1:T_2$ | The value of the maximum electric power energy (mW) |
| --- | --- | --- |
| Example 2A | 1:9 | 540 |
| Example 2B | 2:8 | 800 |
| Example 2C | 3:7 | 890 |
| Example 2D | 4:6 | 1110 |
| Example 2E | 5:5 | 1250 |
| Example 2F | 6:4 | 1670 |
| Example 2G (identical to Example 1A) | 7:3 | 1530 |
| Example 2H | 8:2 | 1420 |
| Example 2I | 9:1 | 980 |

Example 3A

In accordance with Table 4, the pipe-shaped thermoelectric power generation device 81 having a length of 900 millimeters as shown in FIG. 19 was obtained similarly to the case of example 1A.

TABLE 4

| Material of the first cup-shaped component 11 | Oxygen-free copper |
| --- | --- |
| The number of the first cup-shaped component 11 | 199 |
| $dl_1$ | 16 millimeters |
| $ds_1$ | 10 millimeters |
| $T_1$ | 0.95 millimeters |
| theta 1 ($\theta_1$) | 20 |
| Material of the second cup-shaped component 12 | Bismuth |
| The number of the second cup-shaped component 12 | 200 |
| $dl_2$ | 16 millimeters |
| $ds_2$ | 10 millimeters |
| $T_2$ | 0.4 millimeters |
| theta 2 ($\theta_2$) | 20 |
| $T_1:T_2$ | 19:8 |
| Material of the first electrode 15 and the second electrode 16 | Copper |
| The size of the external projection 71 | 1 millimeter long 1 millimeter wide 2 millimeters tall |
| The size of the internal projection 72 | 1 millimeter long 1 millimeter wide 2 millimeters tall |

Examples 3B-3E

The experiments identical to example 3A were performed except for theta 1=theta 2=5, 10, 30 or 45 degrees.

TABLE 5

|  | theta 1 ($\theta_1$), theta 2 ($\theta_2$) | The value of the maximum electric power energy (mW) |
| --- | --- | --- |
| Example 3B | 5 | 200 |
| Example 3C | 10 | 450 |
| Example 3A | 20 | 350 |
| Example 3D | 30 | 180 |
| Example 3E | 45 | 60 |

Examples 4A-4I

The experiments identical to example 3A were performed except that the ratio of $T_1:T_2$ was varied as shown in Table 6.

TABLE 6

|  | $T_1:T_2$ | The value of the maximum electric power energy (mW) |
| --- | --- | --- |
| Example 4A | 1:9 | 210 |
| Example 4B | 2:8 | 230 |
| Example 4C | 3:7 | 270 |
| Example 4D | 4:6 | 300 |
| Example 4E | 5:5 | 330 |
| Example 4F | 6:4 | 350 |
| Example 4G | 7:3 | 350 |
| Example 4H | 8:2 | 280 |
| Example 4I | 9:1 | 180 |

Example 5A

In accordance with Table 7, the pipe-shaped thermoelectric power generation device 81 shown in FIG. 9 was obtained similarly to the case of example 1A. Table 8 shows the result.

TABLE 7

| Material of the first cup-shaped component 11 | aluminum |
| --- | --- |
| The number of the first cup-shaped component 11 | 199 |
| $dl_1$ | 7 millimeters |
| $ds_1$ | 4 millimeters |
| $T_1$ | 0.7 millimeters |
| theta 1 ($\theta_1$) | 20 degrees |
| Material of the second cup-shaped component 12 | PbTe |
| The number of the second cup-shaped component 12 | 200 |
| $dl_2$ | 7 millimeters |
| $ds_2$ | 4 millimeters |
| T2 | 0.3 millimeters |
| theta 2 ($\theta_2$) | 20 degrees |
| $T_1:T_2$ | 7:3 |
| Material of the first electrode 15 and the second electrode 16 | copper |

Examples 5B-5E

The experiments identical to example 5A were performed except for theta 1=theta 2=5, 10, 30 or 45 degrees.

TABLE 8

|  | theta 1 ($\theta_1$), theta 2 ($\theta_2$) | The value of the maximum electric power energy (mW) |
| --- | --- | --- |
| Example 5B | 5 | 1550 |
| Example 5C | 10 | 1510 |
| Example 5A | 20 | 730 |
| Example 5D | 30 | 340 |
| Example 5E | 45 | 90 |

Examples 6A-6I

The experiments identical to Example 5A were performed except that the ratio of $T_1:T_2$ was varied as shown in Table 9.

TABLE 9

| | $T_1:T_2$ | The value of the maximum electric power energy (mW) |
|---|---|---|
| Example 6A | 1:9 | 640 |
| Example 6B | 2:8 | 780 |
| Example 6C | 3:7 | 920 |
| Example 6D | 4:6 | 1050 |
| Example 6E | 5:5 | 940 |
| Example 6F | 6:4 | 810 |
| Example 6G (identical to Example 5A) | 7:3 | 730 |
| Example 6H | 8:2 | 700 |
| Example 6I | 9:1 | 520 |

Example 7A

In accordance with Table 10, the pipe-shaped thermoelectric power generation device 81 having a length of 300 millimeters shown in FIG. 9 was obtained similarly to the case of example 1A. Table 11 shows the result.

TABLE 10

| | |
|---|---|
| Material of the first cup-shaped component 11 | Nickel |
| The number of the first cup-shaped component 11 | 49 |
| $dl_1$ | 14 millimeters |
| $ds_1$ | 10 millimeters |
| $T_1$ | 1.2 millimeters |
| theta 1 ($\theta_1$) | 20 degrees |
| Material of the second cup-shaped component 12 | $Bi_{0.8}Sb_{1.2}Te_3$ |
| The number of the second cup-shaped component 12 | 50 |
| $dl_2$ | 14 millimeters |
| $ds_2$ | 10 millimeters |
| $T_2$ | 0.3 millimeters |
| theta 2 ($\theta_2$) | 20 degrees |
| $T_1:T_2$ | 8:2 |
| Material of the first electrode 15 and the second electrode 16 | copper |

Examples 7B-7E

The experiments identical to Example 7A were performed except for theta 1=theta 2=5, 10, 30 or 45 degrees.

TABLE 11

| | theta 1 ($\theta_1$), theta 2 ($\theta_2$) | The value of the maximum electric power energy (mW) |
|---|---|---|
| Example 7B | 5 | 860 |
| Example 7C | 10 | 1710 |
| Example 7A | 20 | 1260 |
| Example 7D | 30 | 570 |
| Example 7E | 45 | 160 |

Examples 8A-8I

The experiments identical to Example 7A were performed except that the ratio of $T_1:T_2$ was varied as shown in Table 12. Table 12 shows the results.

TABLE 12

| | $T_1:T_2$ | The value of the maximum electric power energy (mW) |
|---|---|---|
| Example 8A | 1:9 | 1760 |
| Example 8B | 2:8 | 1750 |
| Example 8C | 3:7 | 1610 |
| Example 8D | 4:6 | 1480 |
| Example 8E | 5:5 | 1390 |
| Example 8F | 6:4 | 1330 |
| Example 8G | 7:3 | 1300 |
| Example 8H (identical to Example 7A) | 8:2 | 1260 |
| Example 8I | 9:1 | 1060 |

Example 9A

In accordance with Table 13, the pipe-shaped thermoelectric power generation device 81 having a length of 300 millimeters shown in FIG. 9 was obtained similarly to the case of example 1A. Table 14 shows the result.

TABLE 13

| | |
|---|---|
| Material of the first cup-shaped component 11 | Cobalt |
| The number of the first cup-shaped component 11 | 49 |
| $dl_1$ | 14 millimeters |
| $ds_1$ | 10 millimeters |
| $T_1$ | 1.2 millimeters |
| Theta 1 ($\theta_1$) | 20 degrees |
| Material of the second cup-shaped component 12 | $Bi_2Te_{2.9}$ |
| The number of the second cup-shaped component 12 | 50 |
| $dl_2$ | 14 millimeters |
| $ds_2$ | 10 millimeters |
| $T_2$ | 0.3 millimeters |
| Theta 2 ($\theta_2$) | 20 degrees |
| $T_1:T_2$ | 8:2 |
| Material of the first electrode 15 and the second electrode 16 | copper |

Examples 9B-9E

The experiments identical to Example 9A were performed except for theta 1=theta 2=5, 10, 30 or 45 degrees.

TABLE 14

| | theta 1 ($\theta_1$), theta 2 ($\theta_2$) | The value of the maximum electric power energy (mW) |
|---|---|---|
| Example 9B | 5 | 860 |
| Example 9C | 10 | 2050 |
| Example 9A | 20 | 1330 |
| Example 9D | 30 | 560 |
| Example 9E | 45 | 150 |

Examples 10A-10I

The experiments identical to Example 9A were performed except that the ratio of $T_1:T_2$ was varied as shown in Table 15. Table 15 shows the results.

TABLE 15

| | $T_1:T_2$ | The value of the maximum electric power energy (mW) |
|---|---|---|
| Example 10A | 1:9 | 2030 |
| Example 10B | 2:8 | 1920 |
| Example 10C | 3:7 | 1710 |

TABLE 15-continued

| | $T_1:T_2$ | The value of the maximum electric power energy (mW) |
|---|---|---|
| Example 10D | 4:6 | 1550 |
| Example 10E | 5:5 | 1440 |
| Example 10F | 6:4 | 1370 |
| Example 10G | 7:3 | 1340 |
| Example 10H (identical to Example 9A) | 8:2 | 1330 |
| Example 10I | 9:1 | 1180 |

INDUSTRIAL APPLICABILITY

The present subject matter provides a novel pipe-shaped thermoelectric power generating device.

REFERENCE SIGNS LIST 11 first cup-shaped component
  111 first external surface
  112 first internal surface
  113 first through-hole
12 second cup-shaped component
  121 second external surface
  122 second internal surface
  123 second through-hole
15 first electrode
16 second electrode
18 internal through-hole
61 internal wall
71 external wall
81 pipe-shaped thermoelectric power generation device
91 jacket
101 insulation layer

What is claimed is:

1. A pipe-shaped thermoelectric power generation device having two ends apart from each other along an axis direction, comprising:
an internal through-hole along the axis direction of the pipe-shaped thermoelectric power generation device;
a plurality of first cup-shaped components each made of metal;
a plurality of second cup-shaped components each made of thermoelectric material;
a first electrode; and
a second electrode; wherein:
the plurality of the first cup-shaped components and the plurality of second cup-shaped components are arranged alternately and repeatedly along the axis direction of the pipe-shaped thermoelectric power generation device,
the first electrode and the second electrode are provided respectively at one end and at another end of the pipe-shaped thermoelectric power generation device,
each of the first cup-shaped components has a shape of a circular truncated cone, a shape of an elliptical truncated cone, or a shape of a truncated pyramid,
each of the first cup-shaped components has a first internal surface and a first external surface,
the first internal surface has a shape of a periphery of a circular truncated cone, a shape of a periphery of an elliptical truncated cone, or a shape of a periphery of a truncated pyramid,
the first external surface has a shape of a periphery of a circular truncated cone, a shape of a periphery of an elliptical truncated cone, or a shape of a periphery of a truncated pyramid,
each of the first cup-shaped components comprises a first through-hole at a bottom end thereof,
a cross-sectional area of each of the first cup-shaped components decreases in the direction toward the bottom end thereof,
each of the second cup-shaped components has a shape of a circular truncated cone, a shape of an elliptical truncated cone, or a shape of a truncated pyramid,
each of the second cup-shaped components has a second internal surface and a second external surface,
the second internal surface has a shape of a periphery of a circular truncated cone, a shape of a periphery of an elliptical truncated cone, or a shape of a periphery of a truncated pyramid,
the second external surface has a shape of a periphery of a circular truncated cone, a shape of a periphery of an elliptical truncated cone, or a shape of a periphery of a truncated pyramid,
each of the second cup-shaped components comprises a second through-hole at a bottom end thereof,
a cross-sectional area of each of the second cup-shaped components decreases in the direction toward the bottom end thereof,
the internal through-hole along the axis direction of the pipe-shaped thermoelectric power generation device is composed of the plurality of the first through-holes and the plurality of the second through-holes,
each of the first cup-shaped components is inserted in one of adjacent second cup-shaped components of the plurality of second cup-shaped components in such a manner that the first external surface of the each of the first cup-shaped components is adhered to the second internal surface of the one of adjacent second cup-shaped components,
another one of adjacent second cup-shaped components of the plurality of second cup-shaped components is inserted in the each of the first cup-shaped components in such a manner that the first internal surface of the each of the first cup-shaped components is adhered to the second external surface of the another one of adjacent second cup-shaped components,
the metal is nickel, cobalt, copper, aluminum, silver, gold, or alloy thereof,
the thermoelectric material is Bi, $Bi_2Te_3$, PbTe, or $Bi_2Te_3$ containing Sb or Se, and
the following mathematical formulas are satisfied:

$$5 \text{ degrees} \leq \theta 1 \leq 45 \text{ degrees}$$

$$5 \text{ degrees} \leq \theta 2 \leq 45 \text{ degrees, and}$$

$$\theta 1 = \theta 2,$$

where θ1 represents an angle formed by a part of the first cup-shaped component in which the cross-sectional area is decreased and an axis direction of the first cup-shaped component, and
θ2 represents an angle formed by a part of the second cup-shaped component in which the cross-sectional area is decreased and an axis direction of the second cup-shaped component.

2. The pipe-shaped thermoelectric power generation device according to claim 1, wherein the metal is nickel, cobalt, copper, or aluminum.

3. The pipe-shaped thermoelectric power generation device according to claim 1, wherein:

the first external surface of the each of the first cup-shaped components is in contact with the second internal surface of the one of adjacent second cup-shaped components, and the first internal surface of the each of the first cup-shaped components is in contact with the second external surface of the another one of adjacent second cup-shaped components.

4. The pipe-shaped thermoelectric power generation device according to claim 1, wherein:

solder is supplied between the first external surface of the each of the first cup-shaped components and the second internal surface of the one of adjacent second cup-shaped components, and solder is supplied between the first internal surface of the each of the first cup-shaped components and the second external surface of the another one of adjacent second cup-shaped components.

5. The pipe-shaped thermoelectric power generation device according to claim 1, further comprising a tubular jacket, wherein the pipe-shaped thermoelectric power generation device is inserted in the tubular jacket.

6. The pipe-shaped thermoelectric power generation device according to claim 1, wherein an insulated internal wall is arranged around the internal through-hole.

7. The pipe-shaped thermoelectric power generation device according to claim 1, wherein an insulated external wall is arranged around pipe-shaped thermoelectric power generation device.

8. A thermoelectric power generator comprising n pipe-shaped thermoelectric power generation devices, the n pipe-shaped thermoelectric power generation devices including a first pipe-shaped thermoelectric power generation device disposed within an $n^{th}$ pipe-shaped thermoelectric power generation device with one or more pipe-shaped thermoelectric power generation devices disposed therebetween wherein:

n is a natural number of three or more, each of the n pipe-shaped thermoelectric power generation devices is the pipe-shaped thermoelectric power generation device according to claim 1, a cross-sectional area of the first pipe-shaped thermoelectric power generation device is smallest, a cross-sectional area of the $n^{th}$ pipe-shaped thermoelectric power generation device is largest, and a cross-sectional area of each of the one or more pipe-shaped thermoelectric power generation devices disposed between the first pipe-shaped thermoelectric power generation device and the $n^{th}$ pipe-shaped thermoelectric power generation devices increases in size from the first pipe-shaped thermoelectric power generation device to the $n^{th}$ pipe-shaped thermoelectric power generation device, wherein an external surface of the first pipe-shaped thermoelectric power generation device is adhered to an internal surface of the one or more pipe-shaped thermoelectric power generation devices that is closest to the first pipe-shaped thermoelectric power generation device through an insulation layer, the internal surface of the $n^{th}$ pipe-shaped thermoelectric power generation device is connected to an external surface of the one or more pipe-shaped thermoelectric power generation devices that is closest to the $n^{th}$ pipe-shaped thermoelectric power generation device through an insulation layer and internal and external surfaces of the one or more pipe-shaped thermoelectric power generation devices are adhered to one another through an insulation layer in order of increasing cross-sectional area from the first pipe-shaped thermoelectric power generation device to the $n^{th}$ pipe-shaped thermoelectric power generation device.

9. The thermoelectric power generator according to claim 8, wherein:

each first electrode is connected to one another, each second electrode is connected to one another, and the n pipe-shaped thermoelectric power generation devices are electrically connected in parallel.

10. A method for generating an electric power with use of a pipe-shaped thermoelectric power generator, the method comprising steps of:

(a) preparing the thermoelectric power generator according to claim 9; and (b) applying a temperature difference between the internal through-hole of the first pipe-shaped thermoelectric power generation device and an external surface of the thermoelectric power generator, so as to generate a voltage difference between the first electrodes and the second electrodes.

11. The thermoelectric power generator according to claim 8, wherein:

second electrodes of the odd number-th pipe-shaped thermoelectric power generation devices from a first to a $(2m-1)^{th}$ are electrically connected to second electrodes of the even number-th pipe-shaped thermoelectric power generation devices from a second to a $(2m)^{th}$, respectively, n is an odd number of three or more, the value of m is defined by the formula: m=(n−1)/2, first electrodes of the even number-th pipe-shaped thermoelectric power generation devices from a second to a $(2m)^{th}$ are electrically connected to first electrodes of the odd number-th pipe-shaped thermoelectric power generation devices from a third to a $(2m+1)^{th}$, respectively, and the n pipe-shaped thermoelectric power generation devices are electrically connected in series.

12. A method for generating an electric power with use of a pipe-shaped thermoelectric power generator, the method comprising steps of:

(a) preparing the thermoelectric power generator according to claim 11, and (b) applying a temperature difference between the internal through-hole of the first pipe-shaped thermoelectric power generation device and an external surface of the thermoelectric power generator, so as to generate a voltage difference between the first electrode of the first pipe-shaped thermoelectric power generation device and the second electrode of the $n^{th}$ pipe-shaped thermoelectric power generation device.

13. The thermoelectric power generator according to claim 8, wherein:

second electrodes of the odd number-th pipe-shaped thermoelectric power generation devices of the n pipe-shaped thermoelectric power generation devices from a first to a $(2m-1)^{th}$ are electrically connected to second electrodes of the even number-th pipe-shaped thermoelectric power generation devices from a second to a $(2m)^{th}$, respectively, n is an even number, the value of m is defined by the formula: m=n/2, when n is four or more, first electrodes of the even number-th pipe-shaped thermoelectric power generation devices of the n pipe-shaped thermoelectric power generation devices from a second to a $(2m-2)^{th}$ are electrically connected to first electrodes of the odd number-th pipe-shaped thermoelectric power generation devices from a third to a $(2m-1)^{th}$, respectively, and the n pipe-shaped thermoelectric power generation devices are electrically connected in series.

14. A method for generating an electric power with use of a pipe-shaped thermoelectric power generator, the method comprising steps of:
   (a) preparing the thermoelectric power generator according to claim 13, and
   (b) applying a temperature difference between the internal through-hole of the first pipe-shaped thermoelectric power generation device and an external surface of the thermoelectric power generator, so as to generate a voltage difference between the first electrode of the first pipe-shaped thermoelectric power generation device and the second electrode of the $n^{th}$ pipe-shaped thermoelectric power generation device.

15. The pipe-shaped thermoelectric power generation device according to claim 1, wherein a groove is provided along the axial direction.

16. A method for generating an electric power with use of a pipe-shaped thermoelectric power generation device, the method comprising steps of:
   (a) preparing the pipe-shaped thermoelectric power generation device according to claim 1; and
   (b) applying a temperature difference between the internal through-hole and an external surface of the pipe-shaped thermoelectric power generation device to generate a voltage difference between the first electrode and the second electrode.

17. A thermoelectric power generator comprising first and second pipe-shaped thermoelectric power generation devices, wherein:
   each of the first and second pipe-shaped thermoelectric power generation devices is the pipe-shaped thermoelectric power generation device according to claim 1,
   a cross-sectional area of the first pipe-shaped thermoelectric power generation device is smaller than a cross-sectional area of the second pipe-shaped thermoelectric power generation device, and
   an external surface of the first pipe-shaped thermoelectric power generation device is adhered to an internal surface of the second pipe-shaped thermoelectric power generation device through an insulation layer.

* * * * *